(12) United States Patent
Massabki et al.

(10) Patent No.: US 7,500,215 B1
(45) Date of Patent: Mar. 3, 2009

(54) METHOD OF DEVELOPING APPLICATION-SPECIFIC INTEGRATED CIRCUIT DEVICES

(75) Inventors: Elie H. Massabki, San Carlos, CA (US); Lior Amarilio, Yokneam (IL)

(73) Assignee: Chipx, Incorporated, Santa Clara, CA (US)

( * ) Notice: Subject to any disclaimer, the term of this patent is extended or adjusted under 35 U.S.C. 154(b) by 176 days.

(21) Appl. No.: 11/524,578

(22) Filed: Sep. 20, 2006

Related U.S. Application Data

(60) Provisional application No. 60/720,258, filed on Sep. 23, 2005.

(51) Int. Cl.
*G06F 17/50* (2006.01)
(52) U.S. Cl. ............... 716/18; 716/4; 716/12; 716/17
(58) Field of Classification Search .......... 716/4, 716/12, 17, 18
See application file for complete search history.

(56) References Cited

U.S. PATENT DOCUMENTS 6,080,204 A * 6/2000 Mendel .................. 716/7

* cited by examiner

*Primary Examiner*—Thuan Do
(74) *Attorney, Agent, or Firm*—Pillsbury Winthrop Shaw Pittman LLP

(57) ABSTRACT

A method, computer readable medium apparatus and system for developing an Application-Specific Integrated Circuit ("ASIC") are disclosed. In one embodiment, a method includes defining the functionality of a target ASIC device within a target system, as well as synthesizing circuits for the target ASIC device and a programmable logic device concurrently or nearly concurrently, thereby providing a conversion-less ASIC development flow using one or more programmable devices. In a specific embodiment, the conversion-less ASIC development flow requires no subsequent step of modifying a functional description for the target ASIC device from a functional description expressed in terms of the programmable logic device, thereby reducing an amount of time required to produce the target ASIC device.

21 Claims, 6 Drawing Sheets

METHOD OF DEVELOPING APPLICATION-SPECIFIC INTEGRATED CIRCUIT DEVICES

CROSS REFERENCE TO RELATED APPLICATIONS

This application claims the benefit of U.S. Provisional Application Ser. No. 60/720,258, entitled "Conversionless Development Of Application-Specific Integrated Circuit ("ASIC") Devices," filed Sep. 23, 2005, the contents of which are hereby incorporated by reference in their entirety.

BRIEF DESCRIPTION OF THE INVENTION

This invention relates generally to circuit design and development, and more particularly, to developing an application-specific integrated circuit ("ASIC") while foregoing a conversion, for example, from a Field-Programmable Gate Array ("FPGA") prototype or any other type of programmable logic device to an ASIC device.

BACKGROUND OF THE INVENTION

A traditional design flow for developing ASICs, including standard cell-based ASICs, structured ASICs and other similar types of ASICs, includes a conversion from an FPGA design to an ASIC design. An FPGA-to-ASIC conversion methodology typically employs an FPGA for prototyping purposes. Once the design is proven using the FPGA prototype, the logic of the FPGA serves as a basis for subsequent development of ASIC production devices. The conversion to an ASIC generally requires modifying a functional description for an ASIC device from a functional description expressed in terms of the FPGA. A drawback to this traditional design flow is that the conversion extends time-to-market ("TTM") and increases development costs, among other things. FIG. 1 depicts at least two design flows using conventional FPGA-to-ASIC conversion methodologies.

FIG. 1 illustrates a few conventional ASIC design flows. Design flow 101 begins with a design of programmable logic using FPGA technology 102 for prototyping purposes. After the design is proved, then the design developed for FPGAs is modified during a conversion process 104 to generate a design in a structural ASIC technology 106. Similarly, design flow 103 starts with the design of programmable logic using FPGA technology 102, followed by a conversion process 104 to develop a design in standard cell ASIC technology 108. Both design flows have a drawback of having relatively long design cycles that extends time-to-market.

In view of the foregoing, it would be desirable to minimize at least one of the drawbacks in each of the traditional ASIC design flows using programmable logic.

SUMMARY OF THE INVENTION

A method, computer readable medium, apparatus and system for developing an Application-Specific Integrated Circuit ("ASIC") are disclosed. In one embodiment, a method includes defining the functionality of a target ASIC device within a target system, as well as synthesizing circuits for the target ASIC device and a programmable logic device concurrently or nearly concurrently, thereby providing a conversionless ASIC development flow using one or more programmable devices. In a specific embodiment, the conversion-less ASIC development flow requires no subsequent step of modifying a functional description for the target ASIC device from a functional description expressed in terms of the programmable logic device, thereby reducing an amount of time required to produce the target ASIC device.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION OF EXEMPLARY EMBODIMENTS

Various embodiments of the invention provide for design flows and techniques as well as computer readable media for developing ASIC devices. Advantageously, these design flows are conversionless—there is no requirement for an ASIC design cycle for modifying functional descriptions subsequent to a programmable design cycle. That is, there is no need to modify a functional description for a target ASIC device from a functional description that is expressed in terms of a programmable logic device. In a specific embodiment, a single design flow provides for a programmable logic device and an ASIC rather than two separate design flows, which traditionally are performed in series (e.g., a FPGA is first developed in register transfer level ("RTL"), followed by an ASIC design flow that modifies the RTL). In one embodiment, the conversionless approach uses programmable logic device design conventions and techniques (i.e., a programmable logic development flow) to develop an ASIC design as well as to facilitate design and verification of an intermediate ASIC design in a target system. In addition, various embodiments of the invention insure that both FPGA and ASIC requirements are satisfied throughout the design flows.

Figure 1:
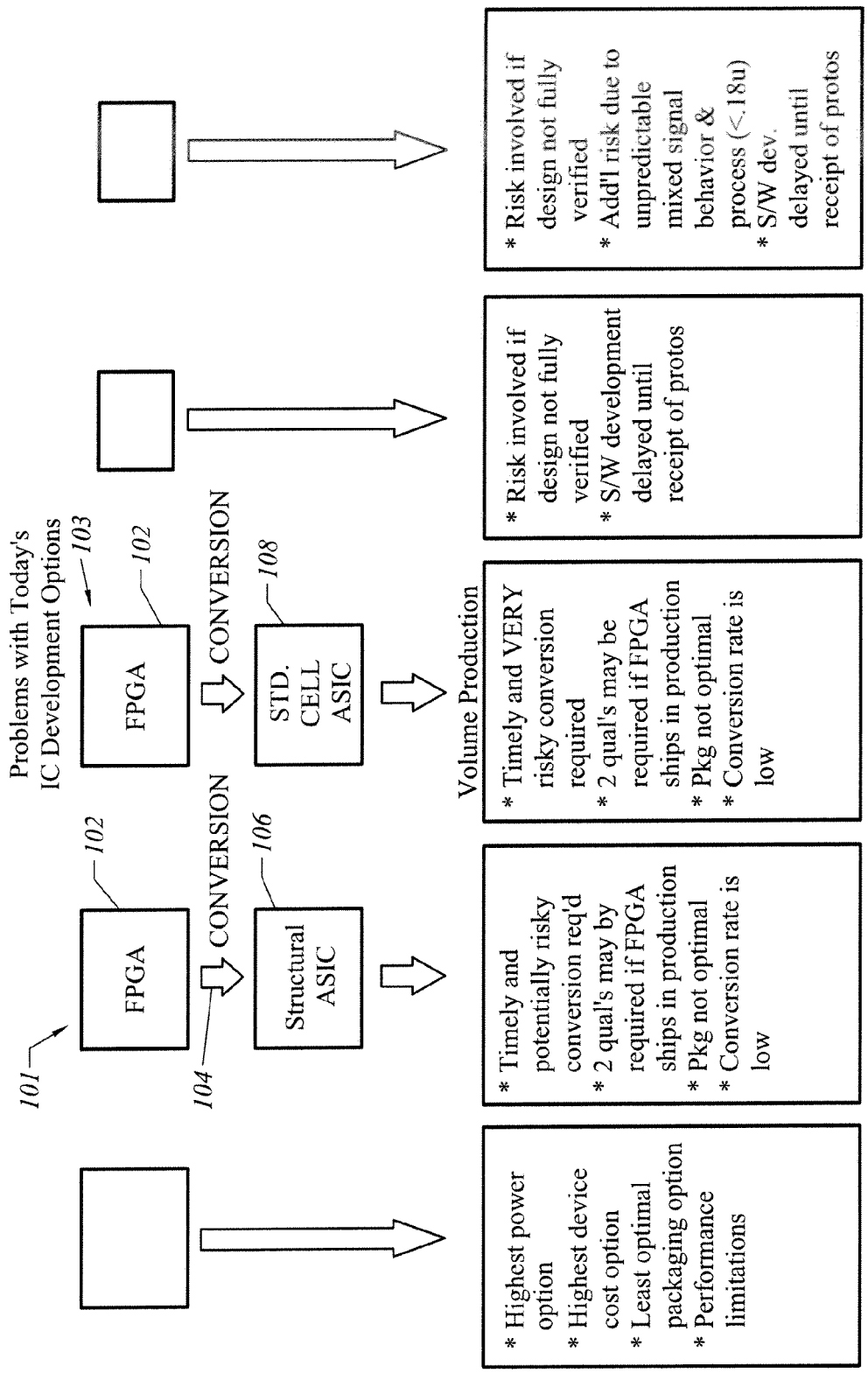
FIG. 1 illustrates conventional ASIC design flows.
Figure 2:
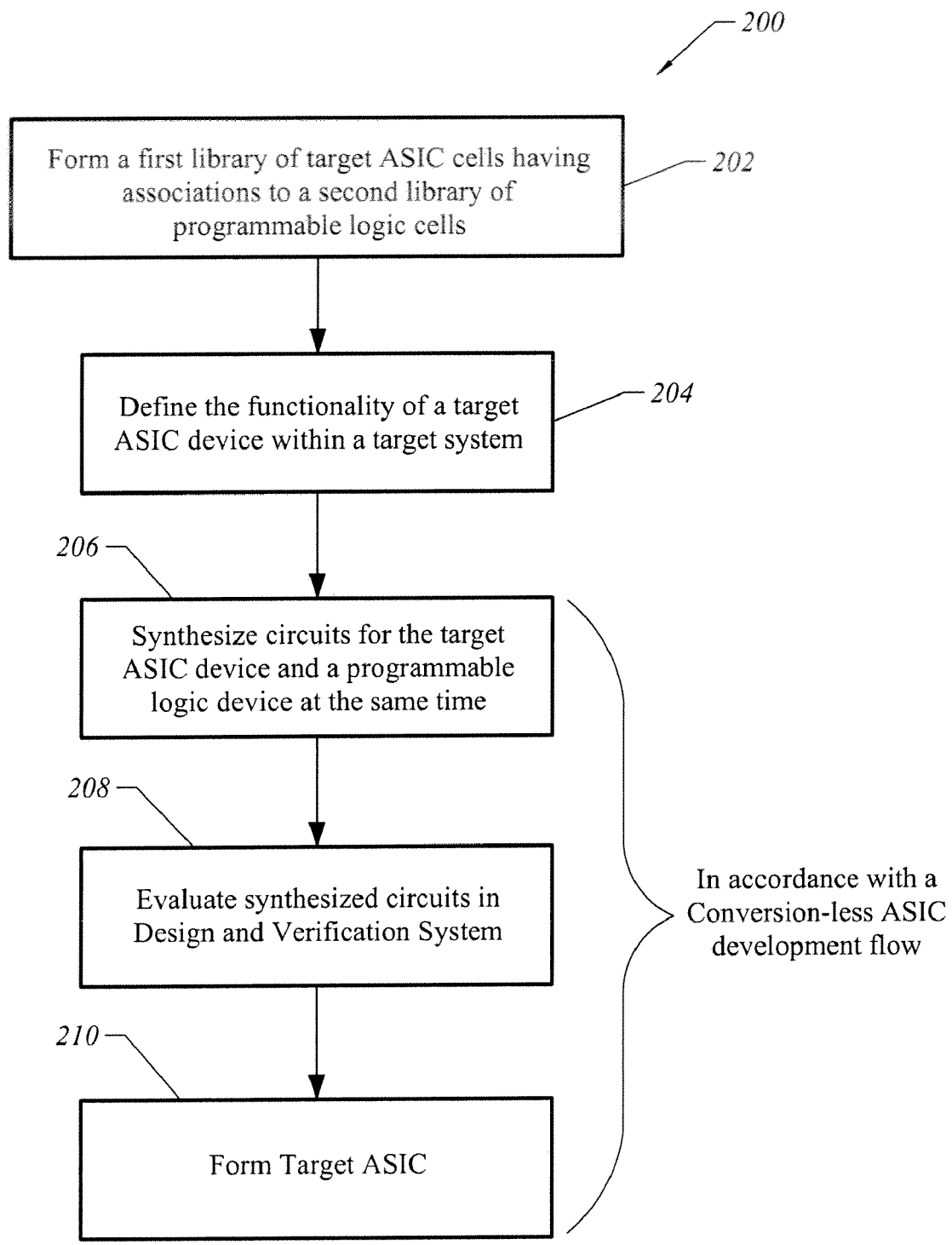
FIG. 2 is a general method for developing ASICs, according to one embodiment of the invention.

FIG. 2 is a general method for developing ASICs, according to one embodiment of the invention. Flow 200 includes formation of a library of target ASIC cells at 202. The library of target ASIC cells includes associations to a second library of programmable logic cells. These associations enable one or more specific cells in a programmable logic device to mimic characteristics of one or more specific cells in a target ASIC device. In particular, one or more cells of the programmable logic device can be configured to form an equivalent cell in the target ASIC. Specifically, programmable logic elements, such as function blocks, can be formatted to have the functionality of target ASIC cells in the target ASIC. As such, a designer can design a target ASIC device using a programmable logic development flow. This is unlike conventional approaches to developing ASICs in which ASIC cells are configured to behave like programmable logic blocks. Advantageously, forming a first library of the target ASIC cells having associations to a second library of programmable logic cells enables a designer to synthesize (i.e., generate gate-level description) either a target ASIC or programmable logic, or both, without a subsequent conversion from a programmable logic design to an ASIC design.

At 204, a designer defines the functionality of a target ASIC device as it is to operate within a target system, as well as a programmable logic device used to implement an in-system design and verification system to prove out the design. By defining the originating technology (i.e., the type of programmable logic device) and the target technology (i.e., the type of target ASIC device), flow 200 can employ the libraries of 202 to develop ASICs in accordance with at least one embodiment of the invention.

At 206, flow 200 enables synthesis of both a target ASIC device and a programmable logic device within a single development flow. Consequently, a designer can synthesize programmable logic for proving out the design in the target system using the design and verification system at 208. After the design is approved, the target ASIC is fabricated at 210.

Figure 3:
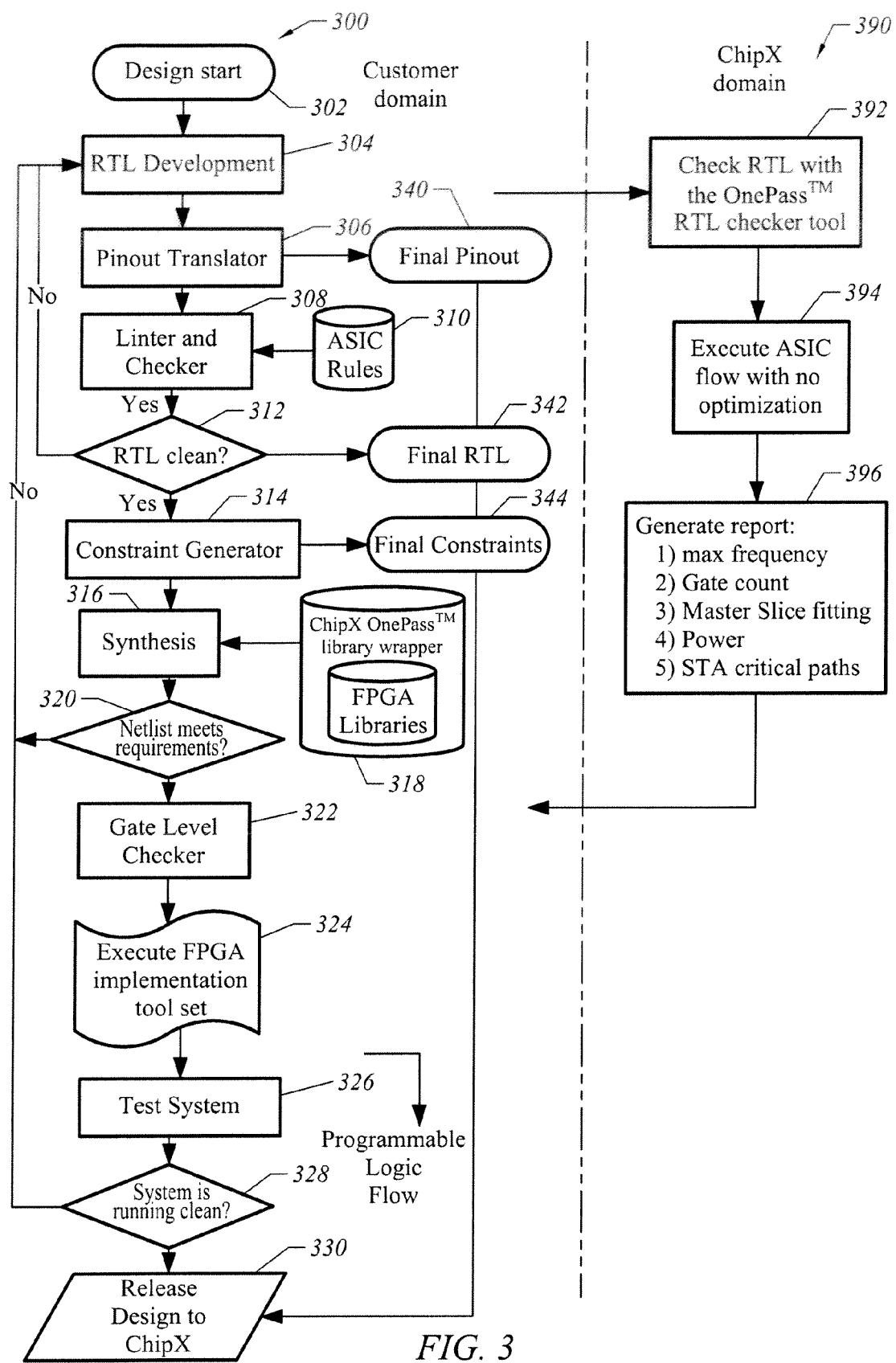
FIG. 3 is an example of a flow for developing ASICs, according to one embodiment of the invention.

FIG. 3 is an example of a flow for developing ASICs, according to one embodiment of the invention. Flow 300 uses programmable logic devices to design a target device without requiring a conversion, such as a FPGA-to-ASIC conversion. At 302, the design of a target ASIC device begins by defining the functionality of a target ASIC device within a target system. At 304, flow 300 generates a functional description of a programmable logic device at 304. This function description, for example, can be implemented in register transfer level ("RTL") and can be used to develop a target ASIC device.

At 306, the pin-out for the target ASIC device, as it resides in the target system, is translated to a design and verification system. In one embodiment, a pin-out translator is a software module that includes executable instructions for performing the pin-out translation. The pin-out translator defines a footprint for the target ASIC and maps the pins of the footprint to a design and verification system containing a programmable logic device and a specialized function circuit. In one embodiment, the pin-out translator at 306 maps signals from each pin of a footprint of the target ASIC device to an input/output ("I/O") for either a programmable logic device or a specialized function circuit, or both, of a design and verification system. A final pin-out is provided at 340.

In another embodiment, pin-out translator at 306 modifies a portion of a target ASIC footprint definition to match a definition of pins for a programmable logic device on the design and verification system. The pin-out translator also modifies another portion of a target ASIC footprint definition to match a footprint of the specialized function circuit on the design and verification system. In at least one embodiment, the pin-out translator also modifies a subset of conductors that provide connections from the target ASIC to conductors in the programmable logic device on the design and verification system and to the specialized function circuit, for example, in a device containing a specialized function on the design and verification system.

Flow 300 continues to 308, at which a linter function is performed to verify the quality of the previously-generated function description. Further, a checker module at 308 provides a flow and a tool for verifying that a design formulated in a programmable logic flow will "fit" in the target ASIC device and behave in the expected manner, such as in terms of timing, latency, delay and speed requirements. In one embodiment, the checker module at 308 checks whether a physical implementation of the functional description is compatible, or will "fit," in the target ASIC device and/or the programmable logic device. The term "physical implementation" generally refers to a netlist after a place and route operation has concluded for either the target ASIC device or the programmable logic device, or both. The term "physical description" generally refers to a netlist prior to place and route in either the target ASIC device or the programmable logic device, or both. At 310, flow 300 verifies whether the functional description complies with a set of ASIC rules prior to synthesizing circuits for the target ASIC device. In at least one embodiment, the set of ASIC rules is used to determine whether a second library of programmable logic cells can implement a first library of target ASIC cells so that the target ASIC device can meet timing, latency, delay and speed requirements. Flow 300 then moves to 312 at which it is determined whether the functional description is satisfactory. If it is, there is final RTL 342.

At 314, a constraint generator creates constraints as part of a programmable logic development flow for both the target ASIC device and the programmable logic device. The constraints for both the target ASIC device and the programmable logic device are finalized at 344. Then, flow 300 moves to perform synthesis at 316 to generate a gate-level netlist at 320. Flow 300 synthesizes circuits at 316 for the target ASIC device and a programmable logic device concurrently or nearly concurrently, thereby providing a conversion-less ASIC development flow using one or more programmable devices. In at least one embodiment, synthesizing circuits for the target ASIC device includes forming a first library of target ASIC cells having associations to a second library of programmable logic cells. In a specific embodiment, flow 300 either forms or uses a wrapper as an interface to configure one or more specific cells in the programmable logic device to mimic characteristics of one or more specific cells in the target ASIC. Such characteristics at least include timing and functional relationships between inputs and outputs. Wrappers, as well as the logic to implement such wrappers, can be stored at 318. The wrapper library is a library of cells that has the same interface and logic functions as the target ASIC cells, but each cell in the wrapper library is constructed from one or more cells from a programmable logic library.

Next, flow 300 continues to 322. Here, a gate-level checker verifies that the gates formed during synthesis at 316 are correctly formed. At 324, a programmable logic tool executes a programmable logic flow for developing ASICs, in whole or in part. At 326, a design and verification system ("test system") is then used to verify the functional description of at least the programmable logic device. A suitable design and verification system for practicing at least one embodiment of the invention is described in U.S. Nonprovisional application Ser. No. 11/229,331, entitled "In-Circuit Device, System and Method to Parallelize Design and Verification of Application-Specific Integrated Circuits ("ASICs") having Embedded Specialized Function Circuits" and filed on Sep. 16, 2005.

If the design and verification system confirms the correctness of the design at 328 (i.e., the design and verification system is clean), then the design is released for manufacturing a target ASIC device at 330.

In some cases, parallel flow 390 can accompany flow 300. Parallel flow 390 can be used to evaluate the functional description can occur any time during flow 300. Parallel flow 390 provides a designer with a capability to upload a design electronically to an evaluator having a tool that automatically completes the design (e.g., by doing the placement and routing) and provides valuable data back to the designer on the "fit" and/or the performance of the design before it is officially handed off to a manufacturer of the target ASIC device.

Advantageously, parallel flow 390 provides feedback during the RTL development cycle, thereby resolving errors in a more expeditious manner.

At 392, an intermediate functional description for both the target ASIC device and the programmable logic device is uploaded to a remote site. At 394, the intermediate functional description is evaluated in an ASIC flow to determine whether the programmable logic device satisfies performance criteria for the target ASIC. Further, a physical implementation is evaluated to determine whether the functional language is compatible with or "fits" in the target ASIC device. Then parallel flow 390 provides feedback at 396 to the designer as to whether the performance criteria are met and whether the physical implementation is compatible with or fits in the target ASIC device. In at least one embodiment, the parallel evaluation is performed automatically by a networked computing system at the remote site without human intervention.

Figure 4:
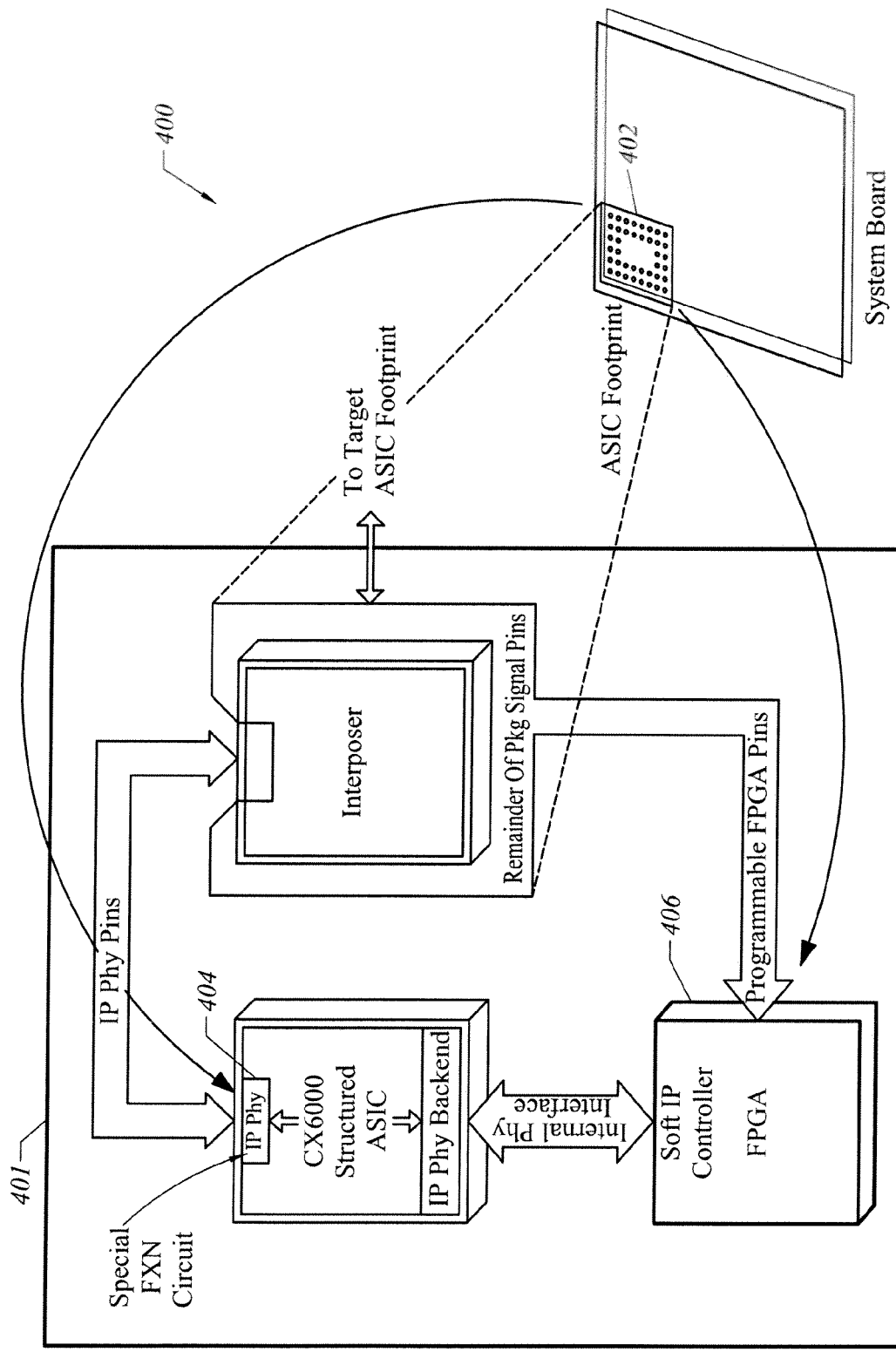
FIG. 4 is a diagram that depicts the pin-out translations of a target ASIC device to a design-verification, according to at least one embodiment of the invention.

FIG. 4 is a diagram 400 that depicts the pin-out translations of a target ASIC device to a design-verification system 401, according to at least one embodiment of the invention. Namely, a pin-out translator of at least one embodiment translates pins in footprint 402 to either a programmable logic device 406 or a specialized function circuit 404.

Figure 5:
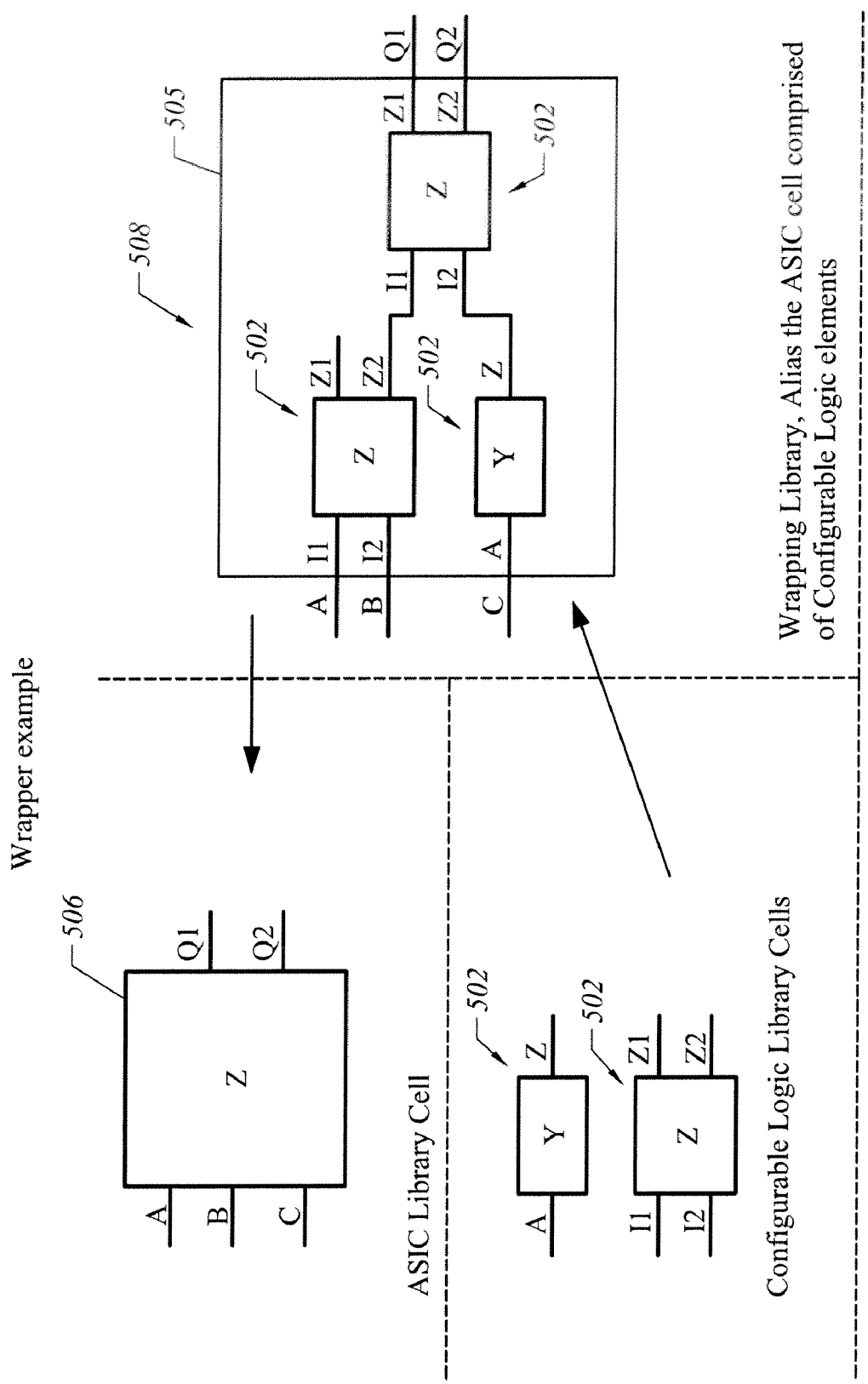
FIG. 5 depicts formation of at least one cell in a wrapping library, according to one embodiment of the invention.

FIG. 5 depicts formation of at least one cell in a wrapping library according to one embodiment of the invention. The wrapping library is a library of cells that has the same interface and operates with the same logic function as the original ASIC cells, but is constructed from one or more cells from the programmable logic library. The wrapping library includes the timing characteristics of the wrapped cell as well as the physical implementation (i.e., the netlist after place and route). For example, consider that a programmable logic library includes programmable logic cells 502, which form the basis of a cell for a target ASIC. Wrapper 505 includes circuitry to adapt the behavior, as well as timing, pinouts, I/Os, etc., of programmable logic cells 502 to form a target ASIC cell.

Figure 6:
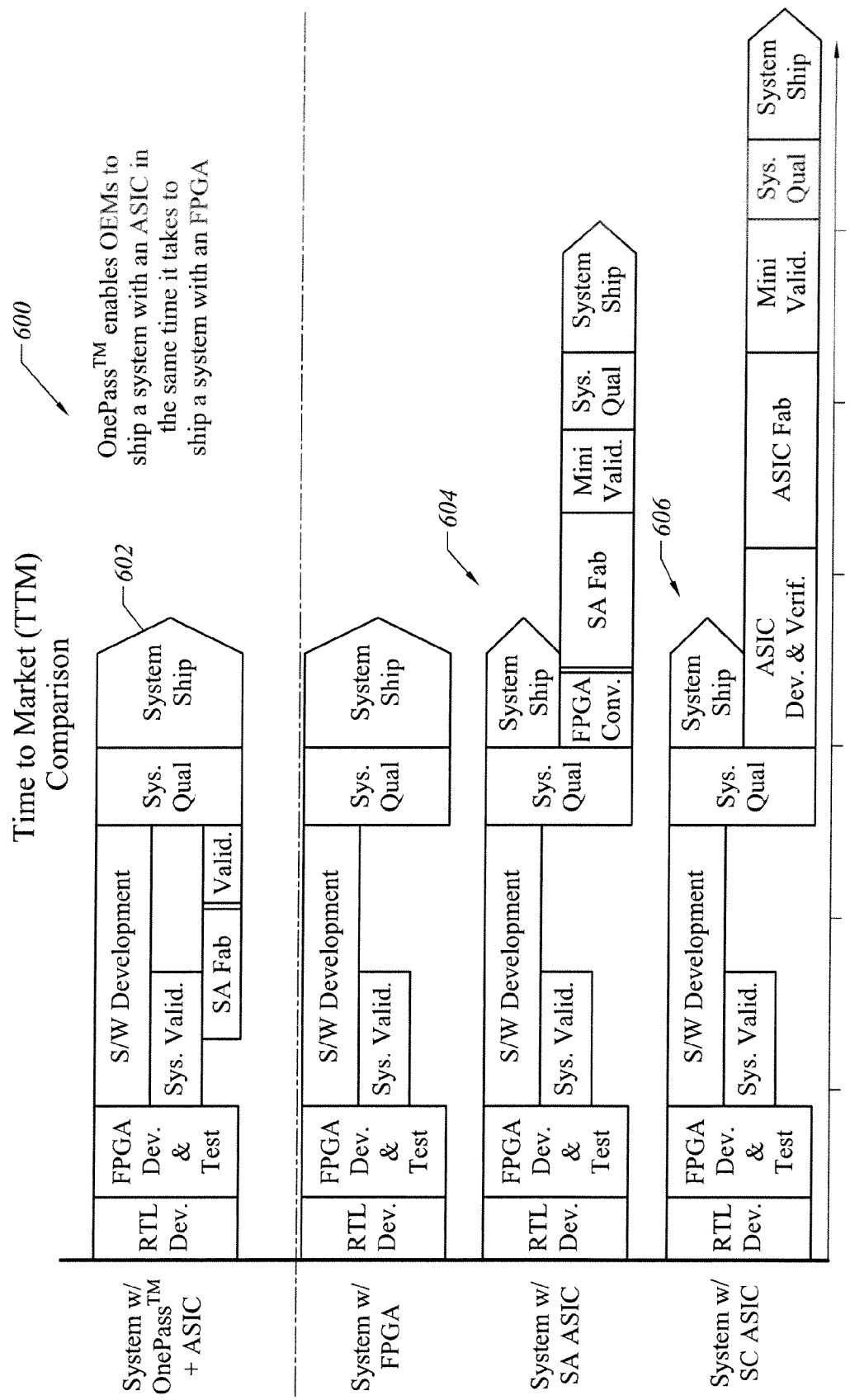
FIG. 6 is a diagram depicting an average time to market for a design flow, according to embodiments of the invention.

FIG. 6 is a diagram 600 for depicting an expected time to market for a design flow, according to embodiments of the invention. As can be seen, design flow 602 enables a relatively quick time to market, relative to the time to market for structured ASIC flow 604 and standard cell ASIC flow 606.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment may readily be interchanged with other embodiments. For example, although the above description of the embodiments relate to an ASIC, the discussion is applicable to all circuits generally.

Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. It is intended that the following claims and their equivalents define the scope of the invention.

The invention claimed is:

1. A method for developing an Application-Specific Integrated Circuit ("ASIC") comprising:
    defining the functionality of a target ASIC device within a target system; and
    synthesizing circuits for said target ASIC device and a programmable logic device concurrently or nearly concurrently using a first library comprising target ASIC cells that includes associations to a second library comprising programmable logic device cells wherein cells of the second library mimic characteristics of cells of the first library, thereby providing a conversion-less ASIC development flow using one or more programmable devices.

2. The method of claim 1 wherein said conversion-less ASIC development flow is obtained using a functional description for said target ASIC device that is substantially unmodified from a functional description expressed in terms of said programmable logic device, thereby reducing an amount of time required to produce said target ASIC device.

3. The method of claim 2 wherein said functional description is described in register transfer level ("RTL").

4. The method of claim 1 wherein synthesizing circuits for said target ASIC device comprises forming said first library.

5. The method of claim 4 wherein forming said first library comprises:
    forming a wrapper as an interface to configure one or more specific cells in said programmable logic device to mimic characteristics of one or more specific cells in said target ASIC.

6. The method of claim 5 wherein said characteristics at least include timing and functional relationships between inputs and outputs.

7. The method of claim 1 further comprising generating a functional description for both said target ASIC device and said programmable logic device concurrently or nearly concurrently.

8. The method of claim 7 further comprising transferring said functional description into a physical description for both said target ASIC and said programmable logic device.

9. The method of claim 8 wherein said physical description is a netlist prior to place and route in either said target ASIC device or said programmable logic device, or both.

10. The method of claim 7 further comprising:
    checking whether a physical implementation of said functional description is compatible or will fit in said target ASIC device and/or said programmable logic device.

11. The method of claim 10 wherein said physical implementation is a netlist after place and route in either said target ASIC device or said programmable logic device, or both.

12. The method of claim 10 wherein said checking includes verifying said functional description complies with a set of ASIC rules associated with said first library prior to synthesizing circuits for said target ASIC device.

13. The method of claim 12 wherein verifying said functional description complies with said set of ASIC rules comprises:
    determining whether said cells of the second library of programmable logic cells implements said cells of the first library of target ASIC cells to provide timing, latency, delay and speed requirements for said target ASIC device.

14. The method of claim 7 further comprising performing a parallel evaluation of said functional description, which includes:
   uploading an intermediate functional description for both said target ASIC device and said programmable logic device to a remote site;
   evaluating whether said intermediate functional description for said programmable logic device satisfies performance criteria for said target ASIC;
   evaluating whether a physical implementation of said functional language is compatible with or fits in said target ASIC device; and
   providing feedback back to a designer as to whether said performance criteria are met and said physical implementation is compatible with or fits in said target ASIC device.

15. The method of claim 14 wherein said parallel evaluation is substantially performed automatically by a networked computing system at said remote site without human intervention.

16. The method of claim 1 further comprising:
   forming said target ASIC device without converting a design expressed in terms of said programmable logic device into another design expressed in terms of said target ASIC device.

17. The method of claim 1 further comprising:
   generating constraints as part of a programmable logic development flow for both said target ASIC device and said programmable logic device.

18. The method of claim 1 further comprising:
   defining a footprint for said target ASIC; and
   mapping pins of said footprint to a design and verification system containing a programmable logic device and a specialized function circuit.

19. The method of claim 18 wherein mapping pins of said footprint further comprises:
   modifying a portion of a target ASIC footprint definition to match a definition of pins for said programmable logic device on said design and verification system.

20. The method of claim 18 wherein mapping pins of said footprint further comprises:
   modifying another portion of a target ASIC footprint definition to match a footprint of said specialized function circuit on said design and verification system.

21. The method of claim 18 further comprising:
   modifying a subset of conductors that interface internally to said specialized function circuit on said target ASIC and connecting said subset of conductors to conductors in said programmable logic device on said design and verification system connected to said specialized function circuit in a device containing a specialized function on said design and verification system.

* * * * *